United States Patent
Gundlach

(10) Patent No.: US 7,134,605 B2
(45) Date of Patent: Nov. 14, 2006

(54) CHIP CARD MODULE

(75) Inventor: Harald Gundlach, Grünwald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/694,601

(22) Filed: Oct. 27, 2003

(65) Prior Publication Data

US 2004/0084539 A1    May 6, 2004

Related U.S. Application Data

(63) Continuation of application No. PCT/DE02/01307, filed on Apr. 9, 2002.

(30) Foreign Application Priority Data

Apr. 25, 2001  (DE) .............................. 101 20 254

(51) Int. Cl.
    *G06K 19/06*  (2006.01)
(52) U.S. Cl. .................. 235/492; 235/488; 235/441; 235/451
(58) Field of Classification Search ............ 235/441, 235/442, 445, 448, 451, 458, 487, 492, 488
    See application file for complete search history.

(56) References Cited

U.S. PATENT DOCUMENTS 4,506,148 A    3/1985  Berthold et al.
4,707,594 A *  11/1987 Roth .......................... 235/488
4,876,441 A *  10/1989 Hara et al. .................. 235/488
5,917,705 A *  6/1999  Kirschbauer et al. ....... 361/737
6,109,530 A *  8/2000  Larson et al. ............... 235/492
6,293,470 B1 * 9/2001  Asplund ...................... 235/487
6,467,692 B1 * 10/2002 Tarantino et al. ........... 235/492
6,619,553 B1 * 9/2003  Bobrov et al. .............. 235/492
6,659,355 B1 * 12/2003 Fischer et al. .............. 235/492
6,783,077 B1 * 8/2004  Fannasch .................... 235/492

FOREIGN PATENT DOCUMENTS

| DE | 31 43 915 A1 | 5/1983 |
| DE | 196 04 374 A1 | 8/1997 |
| DE | 199 12 201 A1 | 8/2000 |
| DE | 199 14 587 A1 | 10/2000 |
| DE | 199 23 138 C1 | 11/2000 |
| DE | 199 33 757 A1 | 1/2001 |
| DE | 199 39 347 C1 | 2/2001 |
| EP | 0 347 897 A1 | 12/1989 |
| FR | 2 722 315 A1 | 1/1996 |
| FR | 2 734 383 A1 | 11/1996 |
| JP | 3-58826 | 6/1991 |
| JP | 04-118297 | 4/1992 |
| JP | 09-311922 | 12/1997 |
| JP | 11-86672 | 3/1999 |

* cited by examiner

*Primary Examiner*—Kimberly D. Nguyen
(74) *Attorney, Agent, or Firm*—Laurence A. Greenberg; Werner H. Stemer; Ralph E. Locher

(57) ABSTRACT

A chip card module is provided for insertion into a card body. The chip card module has at least one component, for example a keypad, fitted on an intermediate carrier configured in the card body. The intermediate carrier is a functional constituent part of the at least one component.

8 Claims, 1 Drawing Sheet

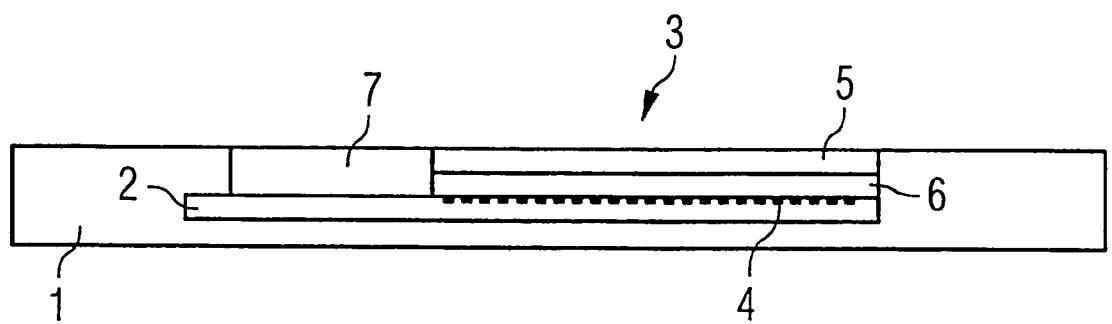

CHIP CARD MODULE

CROSS-REFERENCE TO RELATED APPLICATION

This application is a continuation of copending International Application No. PCT/DE02/01307, filed Apr. 9, 2002, which designated the United States and was not published in English.

BACKGROUND OF THE INVENTION

Field of the Invention

The present invention relates to a flexible module for insertion into a card body for a system-on-card with structural parts at the surface of the card body.

During the production of chip cards it is necessary to insert a plurality of components of a system-on-card at the surface of a flexible carrier or at the surface of the card body. In this case, the components should terminate flush with the carrier or the surface of the card body. Additionally, the standardized thickness of the finished chip card must also not be exceeded.

Since the functionality of chip cards will become increasingly greater through the system-on-card, there is a desire to provide a data input possibility in the chip card.

Known keypads, which have only one key in the simplest case, include a covering sheet and a base sheet. Switching parts, which are generally likewise inserted in a sheet, called the switching sheet, are arranged between the covering sheet and the base sheet. The keypads, which are known from the prior art and which are used, for example, in mobile phones or check card size pocket calculators, are present as finished modules with external contacts that are accessible from the outside. The finished module is inserted into the housing of the mobile phone or pocket calculator, is mechanically connected thereto, and is connected via the electrical contacts to the other components of the telephone or pocket calculator. The keypad modules are too thick, however, to be integrated into a standardized chip card, which has a thickness of approximately 700 µm.

SUMMARY OF THE INVENTION

It is accordingly an object of the invention to provide a chip card module for insertion into a card body, and to provide a chip card including the card body with the chip card module, which overcome the above-mentioned disadvantages of the prior art apparatus of this general type.

In particular, it is an object of the invention to provide a way for components, in particular data input devices, to be inserted into a standard chip card, taking account of the thickness of the chip card, so that a planar surface of the chip card is ensured.

With the foregoing and other objects in view there is provided, in accordance with the invention, a chip card module that includes an intermediate carrier on which at least one component is fitted. After insertion into the card body of a chip card, the intermediate carrier is arranged in the card body, while the one component or at least one of the components is located at the surface of the card body and is therefore accessible from the outside. By virtue of the fact that the intermediate carrier, which is originally present in system-on-cards, is used as a functional constituent part of the component, components which might otherwise not be used on account of their customary thickness can now be integrated into a standardized chip card.

In other words, the invention proposes using the intermediate carrier as a replacement for a constituent part of the component, as a result of which the thickness of the remaining component can be reduced relative to the component that is otherwise present as module.

Components present as modules always have a carrier substrate on which electrical components are applied. At the carrier substrate, external contacts are then regularly fitted either on the underside or at its end edge. These contacts enable the component to be electrically contact-connected.

According to the invention, the carrier substrate can be dispensed with by directly contact-connecting the electrical components of the component to the intermediate carrier of the chip card module. If, in accordance with one advantageous development of the invention, the component is a keypad having at least one key, then the base sheet representing the carrier substrate can be obviated. The switching sheet, which is covered by a covering sheet located at the surface of the card body, can be directly contact-connected to the intermediate carrier.

Therefore, the intermediate carrier preferably has a conductor track structure which serves to produce the electrical connection to the at least one component.

Further components, e.g. a chip module or a display device, may advantageously be provided on the intermediate carrier. The electrical interconnection of the components then becomes particularly simple by using the conductor track structure on the inter-mediate carrier.

By dispensing with the base sheet mentioned above, the thickness of the keypad is reduced in such a way that incorporation into a standardized chip card is possible.

It goes without saying that the invention can be used not only in the case of keypads, but in the case of all components which are usually present as a module and have a carrier substrate with external contacts. In all these components, it is possible to dispense with the carrier substrate with an accompanying reduction of thickness by mounting the respective electrical components directly onto the intermediate carrier.

It goes without saying that further intermediate carriers with respective components can also be arranged in a carrier or card body. In this case, moreover, it is not necessary for each of the intermediate carriers to be fitted in the carrier or card body. One of the further intermediate carriers could simultaneously form the surface of the chip card. Components could be inserted into holes in the intermediate carrier or could be mechanically connected thereto.

With the foregoing and other objects in view there is provided, in accordance with the invention, a chip card including a card body and a chip card module inserted into said card body. The module includes a chip card keypad, at least one additional component, and an intermediate carrier forming a functional component of the keypad and serving as a carrier for the additional component. The keypad is accessible from outside of the module and from outside of the card body.

Other features which are considered as characteristic for the invention are set forth in the appended claims.

Although the invention is illustrated and described herein as embodied in a chip card module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE is a cross sectional view showing an embodiment of a chip module having an intermediate carrier and a component applied thereon.

DESCRIPTION OF THE PREFERRED EMBODIMENTS

Referring now to the sole FIGURE of the drawing in detail, there is shown an intermediate carrier 2 that is inserted into a card body 1 of predetermined size. A chip module 7, which is formed as a finished module of known design, is applied on the intermediate carrier 2. A component, which is not present as a module and which is in the form of a keypad 3, is also applied on the intermediate carrier 2. Both the chip module 7 and the keypad 3 terminate flush with the surface of the card body 1 to produce a planar area. The keypad 3 includes a covering layer 5 located at the surface of the card body 1 and a switching sheet 6 situated between the covering layer 5 and the intermediate carrier 2. The switching sheet 6 includes the electrical components of the keypad 3. That is to say the switching sheet 6 essentially includes the keys. The keys are electrically connected to a conductor track structure 4, which is applied on the intermediate carrier 2. Consequently, the intermediate carrier 2 with the conductor track structure 4 replaces the base sheet described in the introduction. The base sheet is customary in the case of a keypad module with external contacts. The intermediate carrier 2 has thus become a functional constituent part of the keypad 3. As a result of this, the thickness of the keypad 3 is reduced in such a way that the keypad can be incorporated into a standardized chip card body having a thickness of approximately 700 μm. A keypad 3 of this type can be derived from known membrane keypads, such as, those that are known, for example, from mobile phones.

The invention also facilitates the contact-connection of the keypad 3 to the remaining components of a chip card.

The present example merely illustrates a chip module 7 that is likewise mounted on the intermediate carrier 2 and that can be electrically connected to the keypad 3 in a simple manner via the conductor track structure 4. It goes without saying that the invention is not restricted thereto, but rather may include a multiplicity of further components, for example, a display device, an energy storage device, or the like.

In this case, the chip module can be designed with contacts or without contacts or in a hybrid fashion.

I claim:

1. A chip card module for insertion into a card body containing no components, the chip card module comprising:
   a chip card keypad;
   at least one additional component; and
   an intermediate carrier forming a functional component of said keypad and serving as a carrier for said additional component;
   said keypad being accessible from outside of said module and from outside of the card body containing no components.

2. The chip card module according to claim 1, wherein said intermediate carrier includes a conductor track structure for producing an electrical connection between said additional component and said keypad.

3. The chip card module according to claim 1, wherein said keypad has a covering sheet disposed at a surface of the card body and a switching sheet contact-connected to said intermediate carrier.

4. The chip card module according to claim 1, wherein said additional component is a chip module.

5. A chip card, comprising:
   a card body containing no components; and
   a chip card module inserted into said card body;
   said module including a chip card keypad, at least one additional component, and an intermediate carrier forming a functional component of said keypad and serving as a carrier for said additional component; and
   said keypad being accessible from outside of said module and from outside of said card body.

6. The chip card module according to claim 5, wherein said intermediate carrier includes a conductor track structure for producing an electrical connection between said additional component and said keypad.

7. The chip card according to claim 5, wherein:
   said card body has a surface;
   said keypad has a covering sheet disposed at said surface of said card body;
   said keypad has a switching sheet contact connected to said intermediate carrier.

8. The chip card according to claim 5, wherein said additional component is a chip module.

* * * * *